United States Patent
Zhu et al.

(10) Patent No.: US 11,152,230 B2
(45) Date of Patent: Oct. 19, 2021

(54) DEVICE AND METHOD FOR BONDING ALIGNMENT

(71) Applicant: SHANGHAI MICRO ELECTRONICS EQUIPMENT (GROUP) CO., LTD., Shanghai (CN)

(72) Inventors: Zhi Zhu, Shanghai (CN); Jianjun Zhao, Shanghai (CN); Zhijun Huo, Shanghai (CN)

(73) Assignee: SHANGHAI MICRO ELECTRONICS EQUIPMENT (GROUP) CO., LTD., Shanghai (CN)

( * ) Notice: Subject to any disclaimer, the term of this patent is extended or adjusted under 35 U.S.C. 154(b) by 18 days.

(21) Appl. No.: 16/321,702

(22) PCT Filed: Jul. 27, 2017

(86) PCT No.: PCT/CN2017/094611
§ 371 (c)(1),
(2) Date: Jan. 29, 2019

(87) PCT Pub. No.: WO2018/019263
PCT Pub. Date: Feb. 1, 2018

(65) Prior Publication Data
US 2020/0090962 A1   Mar. 19, 2020

(30) Foreign Application Priority Data
Jul. 29, 2016  (CN) .......................... 201610617023.6

(51) Int. Cl.
*B32B 41/00* (2006.01)
*H01L 21/67* (2006.01)
(Continued)

(52) U.S. Cl.
CPC ...... *H01L 21/67092* (2013.01); *H01L 21/681* (2013.01); *H01L 21/68764* (2013.01); *H01L 23/544* (2013.01); *H01L 2223/54426* (2013.01)

(58) Field of Classification Search
CPC ............. H01L 21/67092; H01L 21/681; H01L 21/68764; H01L 23/544;
(Continued)

(56) References Cited

U.S. PATENT DOCUMENTS

2006/0048381 A1 *  3/2006  Woo ................... H01L 21/67144
                                                              29/832
2010/0108237 A1    5/2010  Takasaki
(Continued)

FOREIGN PATENT DOCUMENTS

CN   1216858 A    5/1999
CN   2836237 Y   11/2006
(Continued)

*Primary Examiner* — Michael N Orlando
*Assistant Examiner* — Joshel Rivera
(74) *Attorney, Agent, or Firm* — Muncy, Geissler, Olds & Lowe, P.C.

(57) ABSTRACT

An apparatus and method for bonding alignment are provided. The apparatus for bonding alignment includes a press assembly and an objective lens group (105) disposed on one side of the press assembly. The press assembly includes a first chuck (103) and a rotatable second chuck (104). When support surfaces of the first and second chucks are not parallel to each other, the second chuck is rotated to make the two support surfaces parallel. A first substrate (301) is then loaded on the first chuck, and alignment marks (302) on the first substrate are observed using the objective lens group disposed on one side of the press assembly. A second substrate (501) is loaded on the second chuck, and alignment marks (502) on the second substrate are also observed with the objective lens group. Based on an observation result by the objective lens group, the two substrates are moved so (Continued)

that the alignment marks thereon are aligned and hence the two substrates themselves are aligned. In this method, the chucks are adjusted, prior to the alignment of the substrates. This dispenses with the need for employment of high-precision components and reduces the complexity of the apparatus. Moreover, adjusting the chucks first can ensure control of a global alignment accuracy between the substrates, and in particular, can reduce wedge-shaped errors between the substrates that may result from deformations of the substrates during bonding.

7 Claims, 7 Drawing Sheets

(51) Int. Cl.
*H01L 21/68* (2006.01)
*H01L 21/687* (2006.01)
*H01L 23/544* (2006.01)

(58) Field of Classification Search
CPC .......... H01L 2223/54426; H01L 24/74; H01L 21/185; H01L 21/682
USPC .................... 156/60, 64, 350, 351, 378, 379
See application file for complete search history.

(56) References Cited

U.S. PATENT DOCUMENTS

2010/0139836 A1* 6/2010 Horikoshi ......... H01L 21/67092
156/64
2015/0044786 A1 2/2015 Huang

FOREIGN PATENT DOCUMENTS

| | | |
|---|---|---|
| CN | 100470767 C | 3/2009 |
| CN | 103077904 A | 5/2013 |
| CN | 103137509 A | 6/2013 |
| CN | 203085495 U | 7/2013 |
| CN | 103832969 A | 6/2014 |
| CN | 104835771 A | 8/2015 |
| CN | 104999776 A | 10/2015 |
| CN | 106409704 A | 2/2017 |
| JP | 2004-319835 A | 11/2004 |
| JP | 2009-208084 A | 9/2009 |
| JP | 2011-066287 A | 3/2011 |
| JP | 2012-138423 A | 7/2012 |

* cited by examiner

DEVICE AND METHOD FOR BONDING ALIGNMENT

TECHNICAL FIELD

The present invention relates to the field of semiconductor technology and, in particular, to an apparatus and method for bonding alignment.

BACKGROUND

In semiconductor processes, two semiconductor devices are generally required to be bonded together. Typically, two wafers, one wafer and one glass plate or two glass plates are bonded together. For convenience of description, the wafers and glass plates are collectively referred to as substrates hereinafter. In a current semiconductor process, before two substrates are bonded together, the two substrates are required to be aligned with each other by a bonding apparatus.

In recent years, as the requirements on substrate alignment are getting more and more demanding, and since substrates with larger diameters are being increasingly used, traditionally ignorable errors, such as the errors arising from mechanical movement and substrate deformation, have increased their influence on alignment accuracy currently on the order of microns or less to an extent that they may affect the final alignment accuracy.

In order to solve this problem, it is known: after two objective lens pairs (i.e., a total of four objective lenses) are moved to a reference location, the objective pairs are firstly calibrated, wherein each of the two lens pairs includes an upper objective lens pair and a lower objective lens pair. Then upper and lower substrates are temporarily held on upper and lower chucks respectively and are further leveled. The upper substrate is then moved under the upper objective lens pair, where the positions of two alignment marks on the upper substrate are measured and recorded. After the upper substrate is moved away, the lower substrate is similarly moved under the upper objective lens pair to allow the positions of two alignment marks thereon to be measured and recorded. At last, the upper substrate is returned to the original position, and a relative positional deviation between the alignment mark of the upper substrate and alignment mark of the lower substrate is calculated, based on which the two substrates are moved relative to each other by actuators, resulting in an accurate alignment between the two pairs of alignment marks. Alignment accuracy of this approach totally depends on how accurately the two objective lens pairs can measure the relative positions of the alignment marks on the two substrates. This imposes strict requirements on the calibration of the objective lens pairs and makes it impossible to control errors that may arise from movement of the substrates during the alignment process.

In another conventional method insusceptible to errors arising from movement of the substrates during alignment, the upper and lower substrates are temporarily fixed to the upper and lower chucks respectively, and are further leveled. X-Y positions of the alignment marks on these substrates are respectively measured by the detection devices and transformed into a coordinate system of the whole system. Differing from the above approach, the detection devices used in this method for measuring the positions of the upper and lower substrates in the coordinate system of the whole system have at least 10 times (preferably, 100 times) higher accuracy which not only minimizes any error from movement of the upper and lower substrates by reducing the error to $1/10$ (preferably, $1/100$) but also lowers the requirements on the calibration of the objective lens pairs. Despite its ability to align the alignment marks with very high accuracy, this method requires additional use of a large number of high-precision sensors, which lead to a high complexity of the associated apparatus. Moreover, it is still incapable of detecting global errors caused by substrate deformation or other reasons, in particular the errors in substrate portions other than the alignment marks.

In view of the above, there is a need for further improvements in the conventional apparatuses for bonding alignment to overcome the above problem.

SUMMARY OF THE INVENTION

In order to solve the above problems, the present invention proposes an apparatus and a method for bonding alignment.

To this end, the present invention proposes an apparatus for bonding alignment used to bond two substrates, which comprises a press assembly and an objective lens group disposed on one side of the press assembly. The press assembly comprises a first chuck and a second chuck. The first chuck has a support surface facing toward a support surface of the second chuck, and the first chuck is movable relative to the second chuck. The first chuck is configured to support a first substrate, and the second chuck is configured to support a second substrate. The first chuck or the second chuck has a rotatable structure, and one of the first and second chucks proximate the objective lens group is made of a light-transmissive material. The objective lens group is configured to observe an alignment situation between the first and second substrates within the press assembly, and the first and second chucks are configured to move relative to each other based on the alignment situation observed by the objective lens group.

Preferably, the first chuck is an upper chuck and the second chuck is a lower chuck.

Preferably, the press assembly further comprises an upper actuator coupled to the upper chuck and/or a lower actuator coupled to the lower chuck, the upper actuator configured to drive the upper chuck to move, the lower actuator configured to drive the lower chuck to move.

Preferably, the chuck having the rotatable structure is provided with a leveling device for driving the chuck having the rotatable structure to rotate.

Preferably, the leveling device comprises three leveling mechanisms distributed evenly under the chuck having the rotatable structure, each of the three leveling mechanisms being self-adjustable in height so as to be able to drive the chuck having the rotatable structure to rotate with respect to a horizontal plane.

Preferably, the objective lens group is disposed under the lower chuck, wherein the lower chuck is made of a light-transmissive material.

Alternatively, the objective lens group may be disposed above the upper chuck, wherein the upper chuck is made of a light-transmissive material.

Preferably, the objective lens group is electrically connected to an image sensor. The image sensor configured to image the observed alignment situation through the objective lens group.

Preferably, the first chuck is further connected to a pressure sensor configured to detect a pressure undertaken by the first chuck.

Optionally, the apparatus may further comprise a control system coupled to each of the upper actuator, the lower actuator, the leveling device, the image sensor, the objective lens group and the pressure sensor and is configured to control movement of the upper actuator, the lower actuator, the leveling device and the objective lens group.

The present invention also provides a method for bonding alignment, comprising:

rotating a second chuck so that a support surface of a first chuck for supporting a first substrate is parallel to a support surface of the second chuck;

loading the first substrate on the first chuck and identifying first alignment marks on the first substrate by a light that is emanated from an objective lens group and passes through the second chuck which is made of a light-transmissive material;

loading a second substrate on the second chuck and identifying second alignment marks on the second substrate by the light that is emanated from the objective lens group and passes through the second chuck; and moving the first and second chucks relative to each other so that the first alignment marks are aligned with the second alignment marks.

Preferably, the method further comprises, after the first alignment marks are aligned with the second alignment marks, detecting an alignment situation by using the objective lens group, and if the alignment situation is unacceptable, further moving the first and second chucks relative to each other based on a detected deviation until the first alignment marks are aligned with the second alignment marks.

Preferably, making the support surface of the first chuck parallel to the support surface of the second chuck comprises:

moving the first chuck downward relative to the second chuck until the first chuck comes into contact with the second chuck. The second chuck rotates under an action of the first chuck;

detecting a pressure exerted by the first chuck on the second chuck in real time by using a pressure sensor; and upon the pressure reaching a predetermined value, maintaining a current attitude of the second chuck by using a leveling device and returning the first chuck to an original position.

Compared to the prior art, the present invention offers the following benefits: in the apparatus and method of the invention, the press assembly comprises a first chuck and a rotatable second chuck; when the support surfaces of the first chuck and the rotatable second chuck are not parallel to each other, the second chuck is rotated to make them parallel. The first substrate is then loaded on the first chuck, and the alignment marks on the first substrate are observed using the objective lens group disposed on one side of the press assembly. The second substrate is then loaded on the second chuck, and the alignment marks on the second chuck are also observed with the objective lens group. Based on the observations performed by the objective lens group, the two substrates are moved so that the alignment marks thereon are aligned and hence the two substrates themselves are aligned. According to the present invention, the chucks are adjusted, prior to the alignment of the substrates. This dispenses with the need for employment of high-precision components and reduces the complexity of the apparatus. In particular, a global alignment accuracy between the substrates can be ascertained. Moreover, adjusting the chucks first can ensure control of the global alignment accuracy between the substrates, and in particular, can reduce wedge-shaped errors between the substrates that may result from deformations of the substrates during bonding.

In these figures: 101, a pressure sensor; 102, an upper actuator; 103, an upper chuck; 104, a lower chuck; 105, an objective lens group; 106, a lower actuator; 107, a leveling device; 301, an upper substrate; 302, a first alignment mark; 501, a lower substrate; and 502, a second alignment mark.

DETAILED DESCRIPTION

Particular embodiments of the present invention will be described in detail below with reference to the accompany drawings so that the above objects, features and advantages thereof will become more apparent and readily understood.

Embodiment 1

Figure 1:
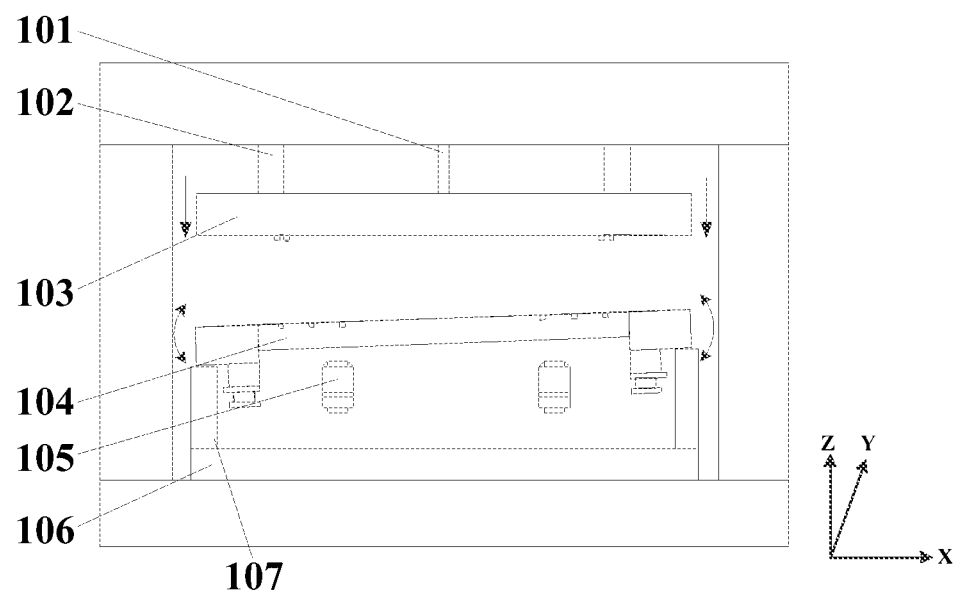
FIG. 1 shows a cross-sectional view of an apparatus for bonding alignment according to Embodiment 1 of the present invention.

Referring to FIG. 1, the present invention provides an apparatus for bonding alignment of two substrates. The apparatus for bonding alignment includes a press assembly comprising, from top to bottom, an upper actuator 102, an upper chuck 103 in fixed connection to the upper actuator 102, a lower chuck 104 having a support surface facing toward a support surface of the upper chuck 103, a leveling device 107 in fixed connection to the lower chuck 104 and a lower actuator 106 in fixed connection to the leveling device 107. The upper chuck 103 is electrically connected to a pressure sensor 101 for detecting a pressure applied by the upper chuck 103 to the lower chuck 104. The upper actuator 102 can drive the upper chuck 103 to move vertically.

Herein, an X-Y-Z three-dimensional coordinate system is defined by an X-axis extending horizontally, a Z-axis extending vertically and a Y-axis extending perpendicular to the X-Z plane defined by the X and Z axes.

Figure 2:
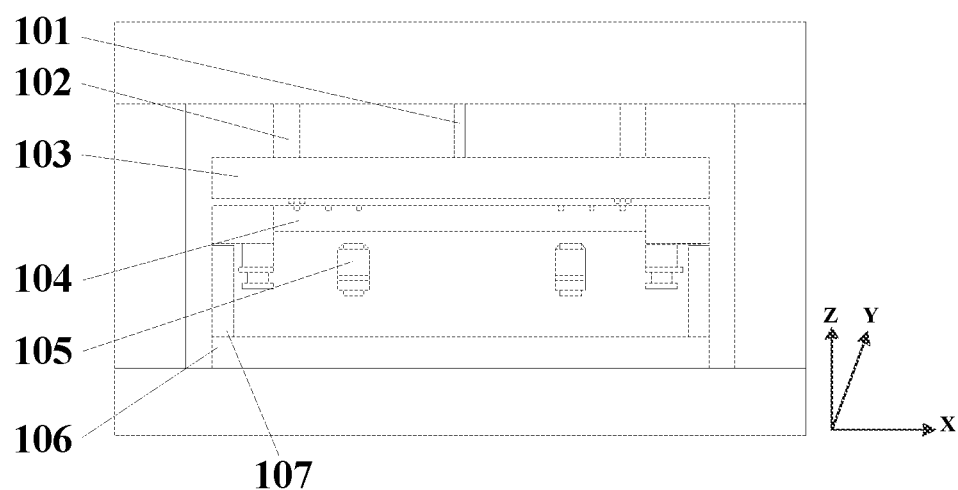
FIG. 2 schematically shows alignment between upper and lower chucks according to Embodiment 1 of the present invention.

Referring to FIG. 2, the leveling device 107 in fixed connection to the lower chuck 104 enables the lower chuck 104 to rotate about the X- or Y-axis. Specifically, the leveling device 107 may include three (preferably) leveling mechanisms evenly distributed with respect to the lower chuck 104. The three mechanisms are self-adjustable in height so that the three mechanisms can present different heights, and thus the lower chuck 104 fixed to the leveling device 107 will intersect the horizontal plane (i.e., the X-Y plane). In other words, the lower chuck 104 can be oriented at various angles in the Rx and Ry directions by adjusting the height of the mechanisms in the leveling device 107.

The objective lens group 105 is disposed under the lower chuck 104, and in order to allow observation through the objective lens group 105, the lower chuck 104 is made of a light-transmissive material such as a transparent material. As such, a spatial relationship between the upper chuck 103 and the lower chuck 104 is observable by the objective lens group 105 through the lower chuck 104 disposed therebetween.

In general, the objective lens group 105 is coupled to an image sensor (not shown) which can visualize what is viewable through the objective lens group 105 and thus help an operator or a computer system observe alignment situation between the two substrates within the press assembly.

The objective lens group 105 may include light sources (not shown) for illuminating the upper chuck 103 and/or the lower chuck 104.

The apparatus for bonding alignment may further include a control system (not shown) coupled to each of the upper actuator 102, the lower actuator 106, the leveling device 107, the pressure sensor 101 and the objective lens group 105. The control system is configured to control movement of the upper actuator 102, the lower actuator 106, the leveling device 107 and the objective lens group 105 based on the alignment situation between the two substrates within the press assembly as imaged by the image sensor and on pressure readings of the pressure sensor 101.

Figure 9:
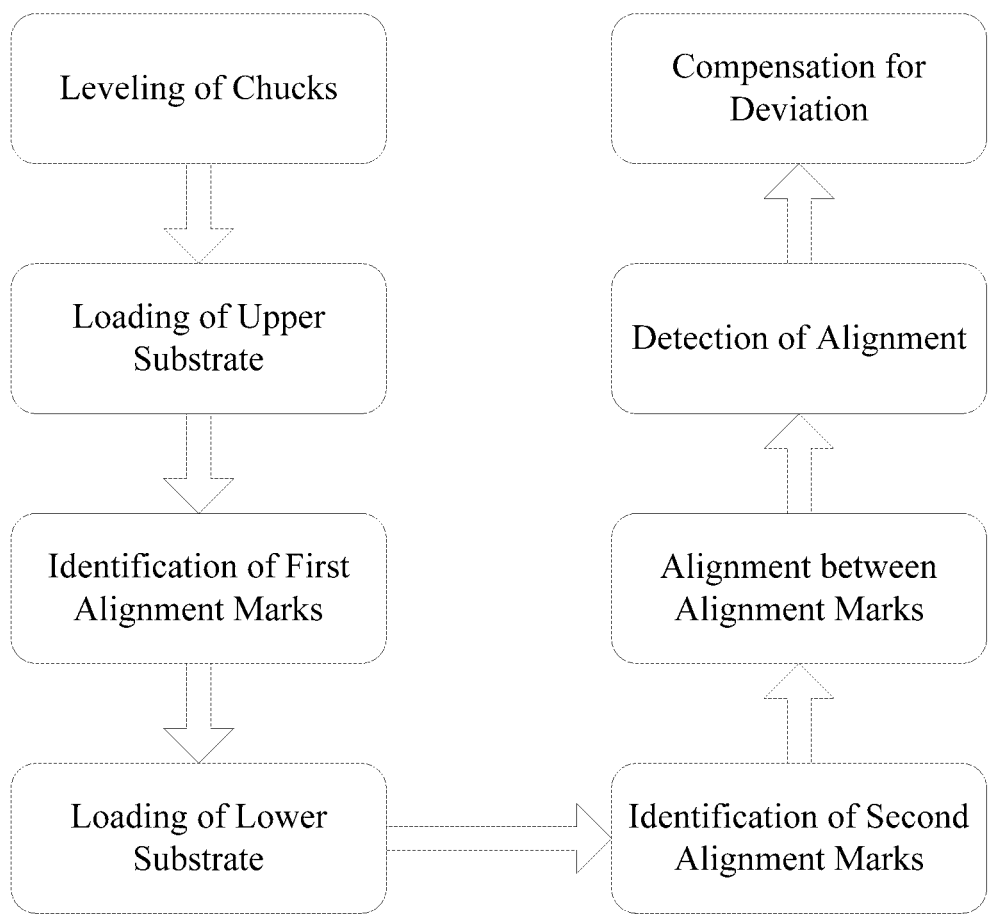
FIG. 9 is a flowchart of a method for bonding alignment according to Embodiment 1 of the present invention.

Referring to FIG. 9, the present invention also provides a method for alignment using the apparatus for bonding alignment as defined above.

Referring to FIG. 1, when the upper and lower chuck 103, 104 are not loaded with the substrates, the upper chuck 103 is at an initial position. Then the upper chuck 103 is caused by the upper actuator 102 to move downward while maintaining a constant orientation. If the gap between the upper and lower chucks 103, 104 is an undesirably wedge-shaped, part of the upper chuck 103 will in contact with the lower chuck 104 earlier than the rest of the upper chuck, exerting a downward pressure on the lower chuck 104. Due to the wedge-shaped error, the downward pressure will create a rotational moment Mx, My on the lower chuck 104 and hence on the leveling device 107. As a result, the orientation of the lower chuck 104 is passively adjusted. That is, the lower chuck 104 is caused to rotate about the X- or Y-axis until it is orientated in the same way as the upper chuck 103. At this point, the wedge-shaped error is eliminated, and the rotational moment Mx, My resulting from the downward pressure is neutralized with respect to its axis. The pressure sensor 101 then starts to detect the upper chuck 103 until the pressure exerted by the upper chuck on the lower chuck 104 reaches a predetermined value such that the orientation of the lower chuck 104 keeps unchanged.

FIG. 2 is a schematic cross-sectional view of the apparatus after the lower chuck 104 has been adjusted with the aid of the leveling device 107. At this point, the orientation of the lower chuck 104 is as same as the orientation of the upper chuck 103 and is maintained by the leveling device 107. The upper actuator 102 then drives the upper chuck 103 to return to its original position.

Figure 3:
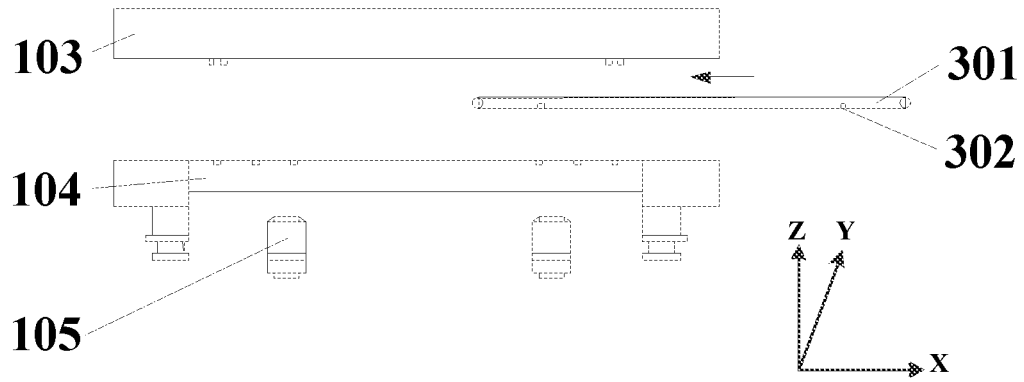
FIG. 3 schematically shows the loading of an upper substrate according to Embodiment 1 of the present invention.

As shown in FIG. 3, the upper substrate 301 is delivered to the upper chuck 103 by transfer device (not shown) such as a mechanical arm and is temporarily retained on the upper chuck 103 by vacuum. First alignment marks 302 on the upper substrate 301 faces away from the upper chuck 103, i.e., toward the lower chuck 104.

Figure 4:
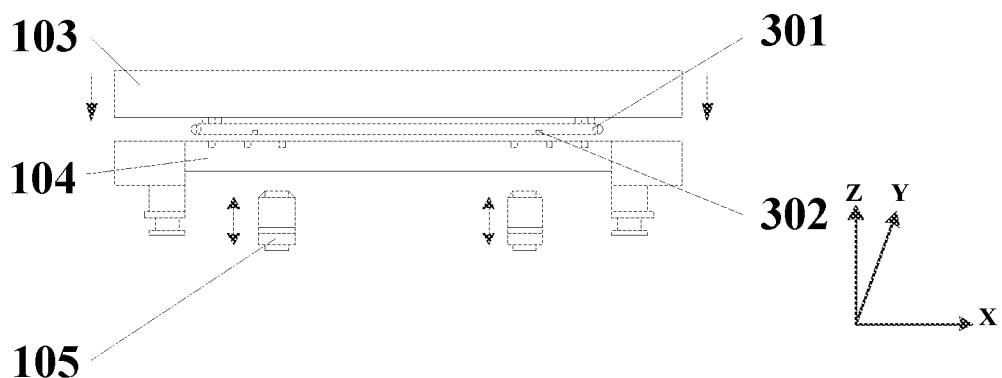
FIG. 4 schematically shows the observation of alignment marks on the upper substrate according to Embodiment 1 of the present invention.

As shown in FIG. 4, under the action of the upper actuator 102, the upper chuck 103 and hence the upper substrate 301 temporarily retained thereon move downward so that the first alignment marks 302 enters a field of view of the objective lens group 105. Since the lower chuck 104 is formed of a transparent material allowing the passage of light from the light sources of the objective lenses. Light beams emanated from the light sources in the objective lens group 105 can transmit through the lower chuck 104 to detect the first alignment marks 302 on the upper substrate 301 held by the upper chuck 103. The objective lens group 105 then performs a search in the X- and Y-direction and, upon identifying the first alignment marks 302, records their positions. The upper actuator 102 moves upward so as to drive the upper chuck 103 back to its original position.

Figure 5:
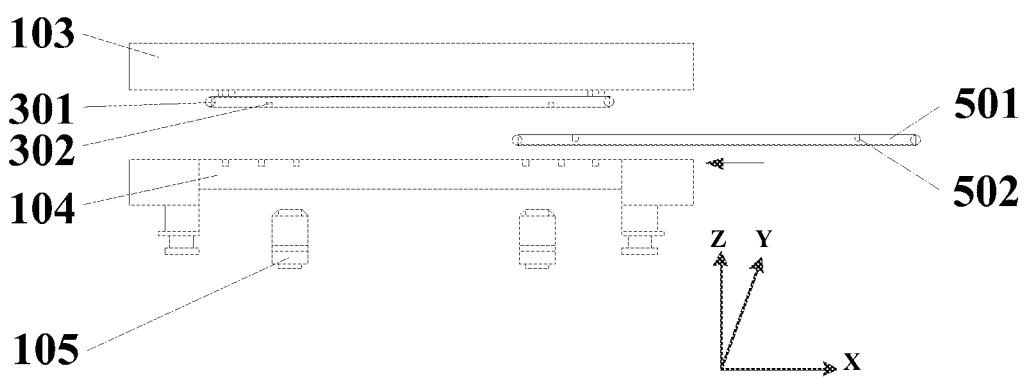
FIG. 5 schematically shows the loading of a lower substrate according to Embodiment 1 of the present invention.

As shown in FIG. 5, the lower substrate 501 is delivered to the lower chuck 104 by transfer device such as a mechanical arm and is temporarily retained thereon by vacuum. Second alignment marks 502 on the lower substrate 501 faces away from the lower chuck 104, i.e., toward the upper substrate 301. When the lower substrate 501 is transparent, light from the light sources in the objective lens group 105 can pass successively through the lower chuck 104 and the lower substrate 501 to detect the second alignment marks 502. When the lower substrate 501 is an opaque substrate, the objective lens group 105 may emit infrared radiation to transmit through the lower substrate 501. In other words, the objective lens group 105 may be equipped with different light sources depending upon the material of the lower substrate 501.

Figure 6:
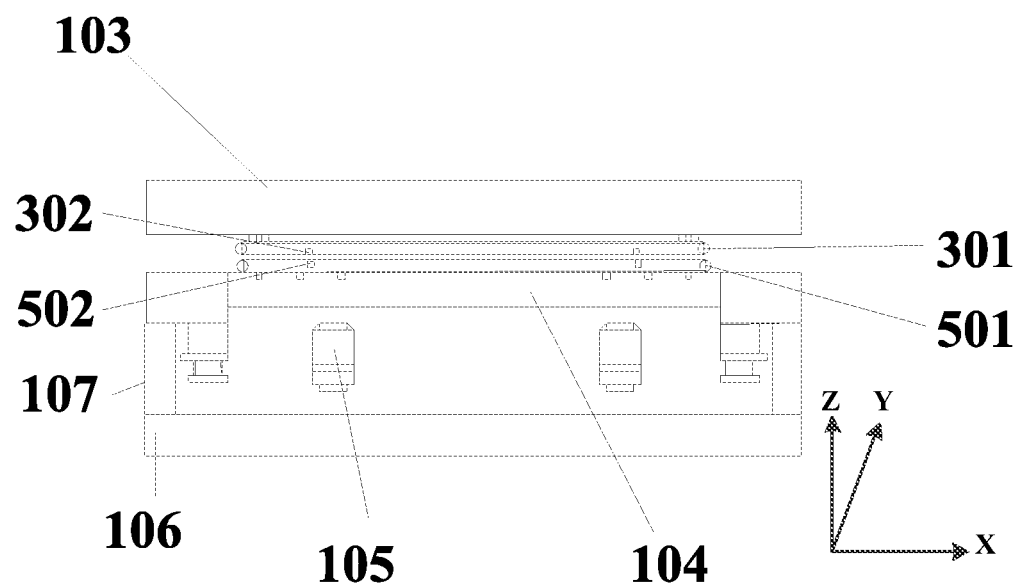
FIG. 6 schematically shows the observation of alignment marks on the lower substrate according to Embodiment 1 of the present invention.

As shown in FIG. 6, the objective lens group 105 performs a search along the X- and Y-directions and, upon finding the second alignment marks 502, records their positions. The lower actuator 106 then drives the second alignment marks 502 to be coincident with the respective first alignment marks 302. Then the upper actuator 102 moves downward and hence the upper substrate 301 on upper chuck 103 is driven to be moved downward so that the first and second alignment marks 302, 502 are all situated within the field of view of the objective lens group 105. The objective lens group 105 measures relative positions of the first and second alignment marks 302, 502 in real time. If there is any deviation found in the relative positions during movement, it may be compensated for by the lower actuator 106, thus ultimately achieving the alignment between the two substrates. The objective lens group 105 can check alignment result of two pairs of alignment marks. Since a material of the lower chuck 104 allowing the light sources of the objective lenses to pass through is transparent, the objective lens group 105 can check the entire area including the upper and lower substrates 301, 501 so that the two substrates may be correctly aligned. Based on this, any possible deviation between the two substrates may be eliminated, for example, by moving the lower actuator 106 or the upper actuator 102.

Figure 7:
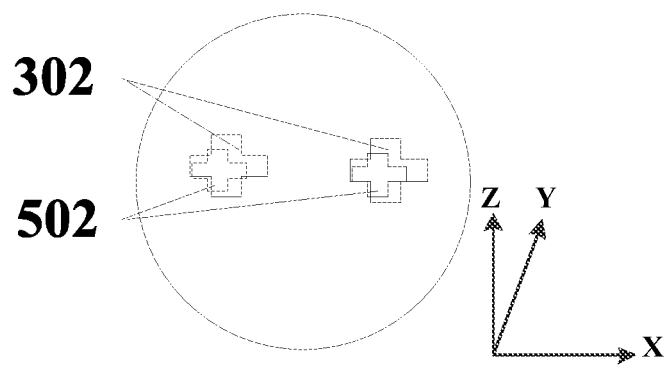
FIG. 7 is a schematic illustration of positions of the alignment marks on the upper and lower substrates according to Embodiment 1 of the present invention.
Figure 8:
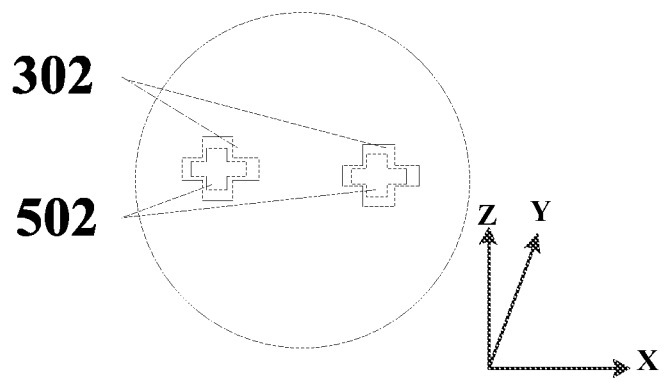
FIG. 8 schematically illustrates the alignment marks on the upper and lower substrates that have been aligned in accordance with Embodiment 1 of the present invention.

In this embodiment, throughout the alignment process, the objective lens group 105 always tracks the relative positions of the first and second alignment marks 302, 502 and images the first and second alignment marks 302, 502 on the image sensor to allow the control system to check whether there is a deviation in the relative positions between the first and second alignment marks 302, 502. FIG. 7 shows a possible scenario where there is a relative positional deviation between the first and second alignment marks 302, 502. Based on this deviation, the lower actuator 106 can be controlled to adjust the lower substrate 501 retained on the lower chuck 104 and hence the relative positions of the first and second alignment marks 302, 502 can be adjusted until an accurate alignment is obtained, as shown in FIG. 8. Throughout the alignment process, the lower actuator 106 may be controlled to move based on the detection results of the objective lens group 105, thereby compensating for any possible error arising from movement of the substrates during this alignment process.

Meanwhile, since the lower chuck 104 in the entire area of the lower substrate 501 is made of a transparent material through which can be penetrated by the adopted light sources. The objective lens group can check whether there is any relative positional deviation at the end of the alignment process. Moreover, in addition to the first and second alignment marks 302, 502, the objective lens group 105 further allows the observation of the relative positional deviation of other marks or special patterns. As such, it is not only possible to verify whether the area of the first and second alignment marks 302 have been accurately aligned with each other, but also more alignment marks can be detected so as to achieve a detection of a global alignment accuracy between the upper and lower substrates 301, 501.

Embodiment 2

Figure 10:
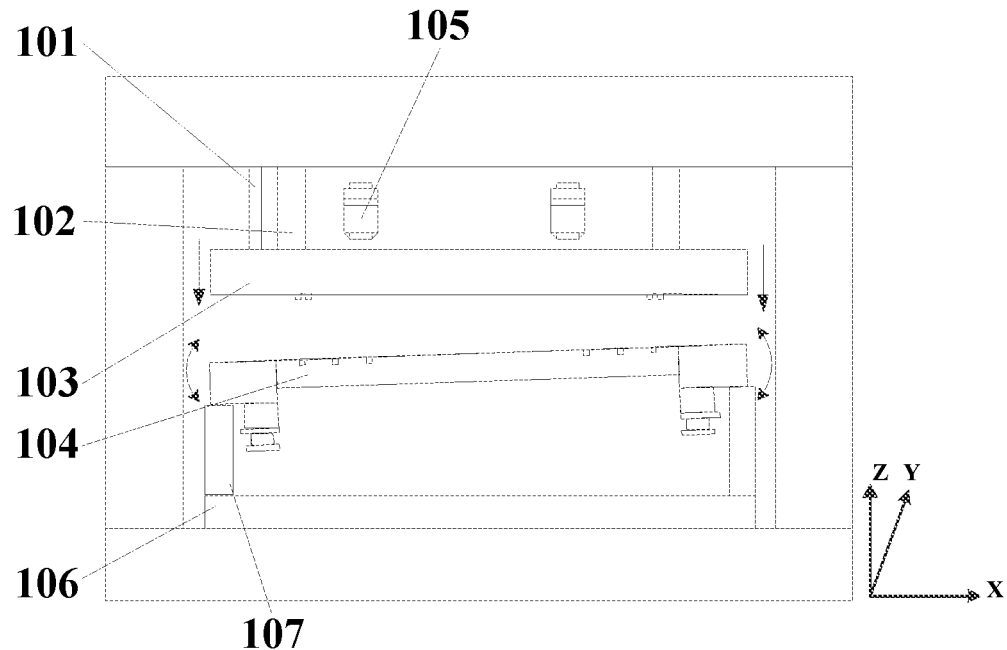
FIG. 10 shows a cross-sectional view of an apparatus for bonding alignment according to Embodiment 2 of the present invention.

This embodiment differs from Embodiment 1 in that the objective lens group 105 is disposed on one side of the upper chuck 103. Referring to FIG. 10, the upper chuck 103 is fixed to the upper actuator 102 and is made of a transparent material allowing the passage of light sources. Similarly, the leveling device 107 is fixedly connected to the lower actuator 106, and the lower chuck 104 is fixed to the leveling device 107. The lower chuck 104 is able to yaw in two degrees of freedom (i.e., Rx and Ry).

Figure 11:
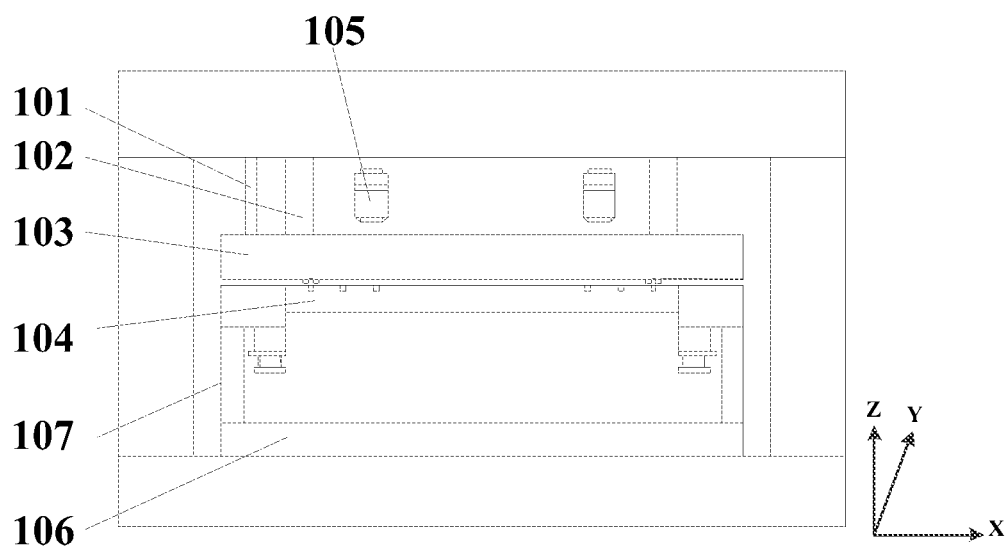
FIG. 11 schematically shows alignment between upper and lower chucks according to Embodiment 2 of the present invention.
Figure 12:
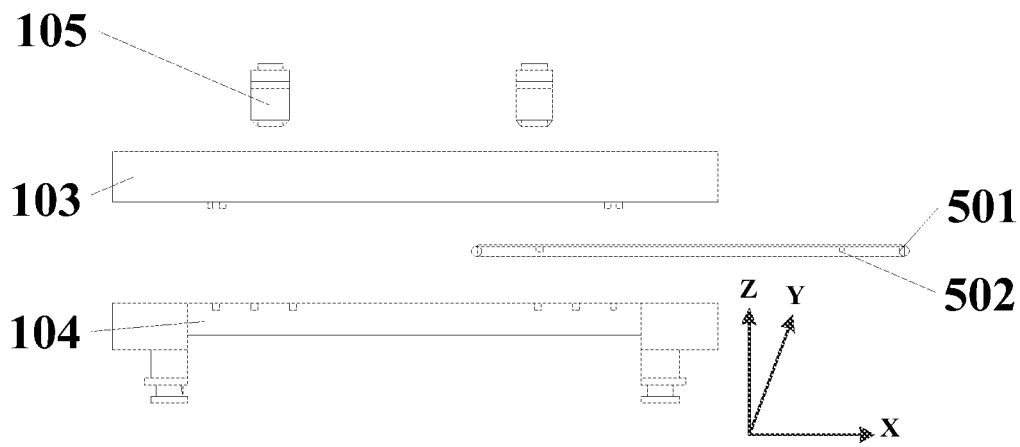
FIG. 12 schematically shows the loading of an upper substrate according to Embodiment 2 of the present invention.
Figure 13:
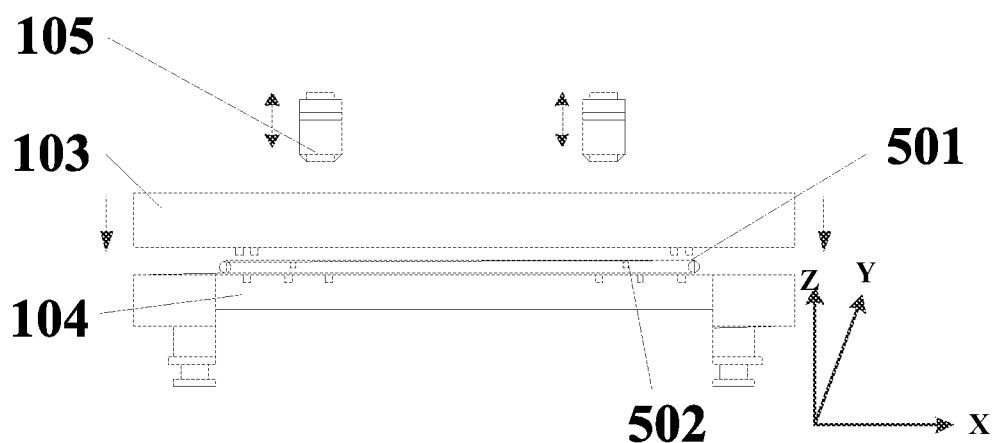
FIG. 13 schematically shows the observation of alignment marks on the upper substrate according to Embodiment 2 of the present invention.
Figure 14:
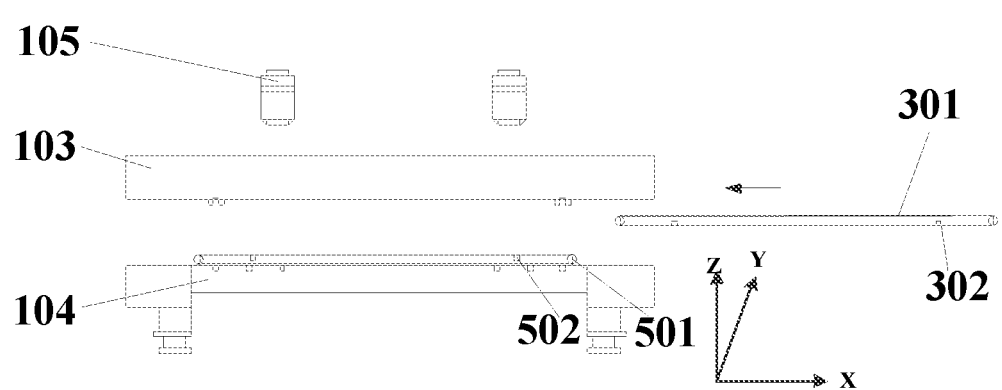
FIG. 14 schematically shows the loading of a lower substrate according to Embodiment 2 of the present invention.
Figure 15:
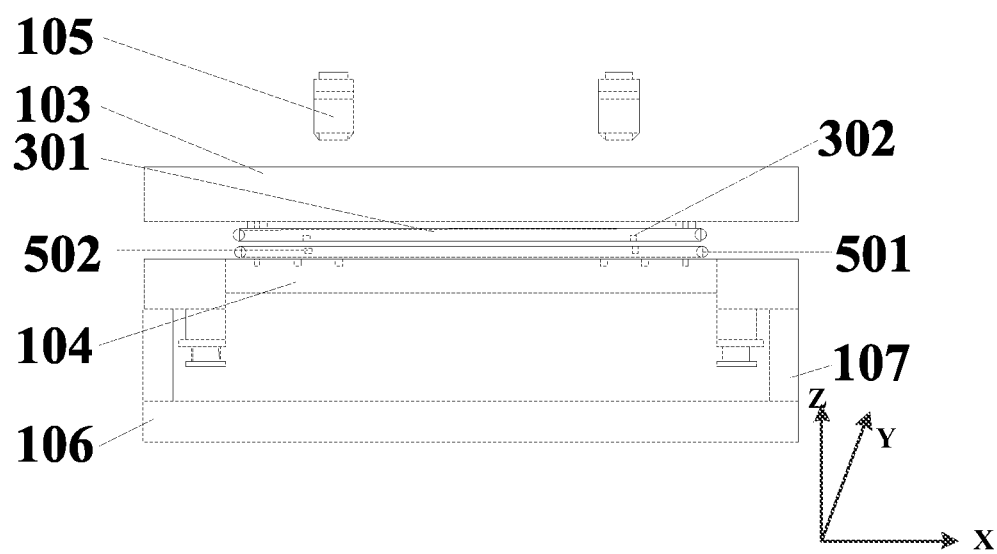
FIG. 15 schematically shows the observation of alignment marks on the lower substrate according to Embodiment 2 of the present invention.

Referring to FIG. 11, the upper chuck 103 moves downward with a constant orientation under the action of the upper actuator 102. Upon the pressure sensor 101 having sensed that a pressure exerted by the upper chuck 103 on the lower chuck 104 reaches a predetermined value, it is determined that a wedge-shaped error has been eliminated, and the upper actuator 102 is then deactivated. The lower chuck 104 maintains this orientation with the aid of the leveling device 107.

Referring to FIGS. 12 to 15, the lower substrate 501 is loaded on the lower chuck 104, and the second alignment marks 502 on the lower substrate are observable through the upper chuck 103 by the objective lens group 105. The upper substrate 301 is then loaded on the upper chuck 103, and the objective lens group 105 observes the first alignment marks 302 on the upper substrate. The relative positions of the first and second alignment marks are detected.

In this embodiment, disposing the objective lens group 105 in the vicinity of the upper chuck 103 to avoid a tight space position in which the leveling device 107 is located, so that the leveling device 107 is able to better regulate and control the lower chuck 104.

According to the present invention, the chucks are adjusted, prior to the alignment of the substrates. This dispenses with the need for employment of high-precision components and reduces the complexity of the apparatus. In particular, global alignment errors between the substrates are detectable in accordance with the present invention.

While the present invention has been described above with reference to the foregoing embodiments, it is not limited to these embodiments disclosed. It is apparent that those skilled in the art can make various modifications and variations to the present invention without departing from the spirit and scope thereof. Accordingly, the invention is intended to embrace all such modifications and variations if they fall within the scope of the appended claims and equivalents thereof.

What is claimed is:

1. A method for bonding alignment, before loading a substrate onto a chuck, comprising:
providing a first chuck and a second chuck that are not loaded with a substrate, wherein: the first chuck faces toward the second chuck in a vertical direction and is movable with respect to the second chuck; and the second chuck is rotatable about a horizontal direction;
moving the first chuck from an original position to a position where the first chuck is in contact with at least a portion of the second chuck;
after the contact, exerting by the first chuck a pressure on the second chuck to create a rotational moment on the second chuck, so that the second chuck rotates with respect to the first chuck;
measuring the pressure exerted by the first chuck to the second chuck in real time by using a pressure sensor; and
upon the pressure reaching a predetermined value, determining that the first and second chucks have a same altitude and orientation;
maintaining the altitude and orientation of the second chuck unchanged and returning the first chuck to the original position.

2. The method for bonding alignment of claim 1, further comprising: coupling a first actuator to the first chuck and/or coupling a second actuator to the second chuck, the first actuator configured to drive the first chuck to move, the second actuator configured to drive the second chuck to move.

3. The method for bonding alignment of claim 1, further comprising: providing the second chuck with a leveling device for driving the second chuck to rotate.

4. The method for bonding alignment of claim 3, further comprising: providing the leveling device with three leveling mechanisms distributed evenly under the second chuck, each of the three leveling mechanisms being self-adjustable in height so as to be able to drive the second chuck to rotate with respect to a horizontal plane.

5. The method for bonding alignment of claim 1, wherein the first chuck is an upper chuck and the second chuck is a lower chuck.

6. The method for bonding alignment of claim 1, further comprising: connecting the first chuck to the pressure sensor configured to detect a pressure undertaken by the first chuck.

7. The method for bonding alignment of claim 1, further comprising:
- loading a first substrate on the first chuck and identifying first alignment marks on the first substrate by a light that is emanated from an objective lens group and passes through the second chuck which is made of a light-transmissive material;
- loading a second substrate on the second chuck and identifying second alignment marks on the second substrate by the light that is emanated from the objective lens group and passes through the second chuck; and
- moving the first and second chucks relative to each other so that the first alignment marks are aligned with the second alignment marks.

* * * * *